Figure 1A:
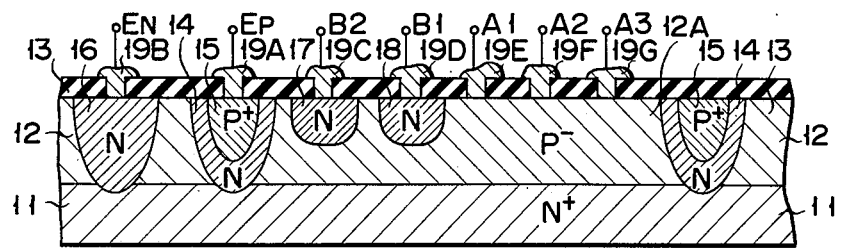

United States Patent [19]

Tokumaru et al.

[11] 4,071,774
[45] Jan. 31, 1978

[54] INTEGRATED INJECTION LOGIC WITH BOTH FAN IN AND FAN OUT SCHOTTKY DIODES, SERIALLY CONNECTED BETWEEN STAGES

[75] Inventors: Yukuya Tokumaru; Masanori Nakai, both of Yokohama, Japan

[73] Assignee: Tokyo Shibaura Electric Co., Ltd., Tokyo, Japan

[21] Appl. No.: 644,085

[22] Filed: Dec. 24, 1975

[51] Int. Cl.² ............................................. H01L 27/04
[52] U.S. Cl. ............................... 307/215; 307/317 A; 357/15; 357/35; 357/36; 357/44; 357/46; 357/86
[58] Field of Search ........................ 357/15, 35, 36, 44, 357/46, 86; 307/213, 214, 215

[56] References Cited

U.S. PATENT DOCUMENTS

| 3,751,680 | 8/1973 | Hodges | 357/86 |
| 3,823,353 | 7/1974 | Berger et al. | 357/44 |
| 3,922,565 | 11/1975 | Berger et al. | 357/44 |

OTHER PUBLICATIONS

Berger, et al., "Schottky Transistor Logic", IEEE International Solid State Circuits Conf., Tech. Dig., pp. 172-173, (Feb. 1975).

Elmasry, Electronics Letters, 6 Feb. 1975, vol. 11, No. 3, pp. 63-64.
Blatt, et al., IEEE IEDM, Technical Digest, pp. 511-514, (Dec. 1974).

*Primary Examiner*—William D. Larkins
*Attorney, Agent, or Firm*—Finnegan, Henderson, Farabow & Garrett

[57] ABSTRACT

In the semiconductor device, a P⁻ conductivity type semiconductor layer is formed on an N+ conductivity type semiconductor substrate by vapor phase growth technique, and a first N conductivity type region is formed in the P⁻ conductivity type layer by diffusion to extend into the N+ conductivity type substrate and to surround a portion of the P-conductivity type semiconductor layer thereby isolating that portion from the remainder. A second conductivity type region is formed in the first region by diffusion and a third N conductivity type region is formed on the isolated region of the P⁻ conductivity type layer. At least one metal region is bonded to the isolated region and at least one metal region is bonded to the third region to form respective metal-semiconductor contact diodes. The second region, the first region and the P⁻ conductivity type layer constitute a lateral PNP transistor while the third region, the P⁻ conductivity type semiconductor layer and the N+ conductivity type semiconductor substrate constitute a vertical NPN transistor.

4 Claims, 10 Drawing Figures

INTEGRATED INJECTION LOGIC WITH BOTH FAN IN AND FAN OUT SCHOTTKY DIODES, SERIALLY CONNECTED BETWEEN STAGES

This invention relates to a semiconductor device comprising a plurality of transistors having different polarity for constituting a logic circuit.

In recent years, an integrated injection logic semiconductor device I²L has become of interest because it has simpler construction, can be manufactured at a higher yield and integrated at a higher density, and consumes less power than prior art diode-transistor logic (DTL), transistor-transistor logic (TTL), current mode logic (CML) and the like. In one example of a prior art integrated injection logic semiconductor device, there are provided a vertical transistor formed on a semiconductor substrate, and acting as an inverter, and a vertical transistor also formed on the semiconductor substrate and acting as a current source for injecting minority carriers into the base region of the vertical transistor and wherein while injecting the minority carriers into the base region of the vertical transistor the collector output thereof is efficiently controlled.

When a plurality of such I²L circuits are combined suitably it is possible to form not only such basic circuit elements as NAND gate circuits, NOR gate circuits and flip-flop circuits but also various large scale integrated circuits having complicated functions. However, such prior art I²L circuit has many problems to be solved. For example, the carrier transfer efficiency of the I²L circuit is low making it impossible to improve the operating characteristics thereof. In order to increase the carrier transfer efficiency, it is necessary to make small the width of the base region of the lateral transistor and to increase the area of the opposing faces of the emitter and collector regions. Actually, however, even when the depth of the emitter and collector regions is made large for the purpose of increasing the opposing area between the emitter and collector regions, the distance between the emitter and collector regions would increase with increase in the depth thereby decreasing the carrier transfer efficiency. For this reason, it has been difficult to increase the current amplification factor of the lateral transistor of the prior art I²L circuit.

On the other hand, since the impurity concentration of the emitter region of the lateral transistor is smaller than that of the emitter region, the minority carriers injected into the base region will be subjected to the action of the deceleration electric field created by the gradient of the impurity concentration, thus decreasing the carrier injection efficiency.

When the impurity concentration of the base region is decreased for the purpose of increasing the carrier injection efficiency of the lateral transistor, since the base region is also used as the emitter region of the vertical transistor, the carrier injection efficiency of the vertical transistor will also be decreased thus decreasing the current amplification factor of the vertical transistor. Owing to various disadvantages described above it has been impossible to obtain I²L semiconductor devices having high operating speeds, excellent frequency characteristic and low power consumption.

Accordingly, it is an object of this invention to provide an improved I²L semiconductor device capable of operating at a high speed which consumes small power and is free from current hogging phenomena.

This object can be accomplished by improving the current amplification factor of a transistor acting as a source as well as a load and by improving the current amplification factor in forward and reverse directions of a transistor acting as an inverter element.

According to this invention, there is provided a semiconductor device comprising a semiconductor substrate of one conductivity type, a semiconductor layer of the opposite conductivity type and formed on the semiconductor substrate, a first region of the one conductivity type extending into the semiconductor substrate to surround a portion of the semiconductor layer thereby defining an isolated region of the opposite conductivity type, a second region of the opposite conductivity type formed in the first region, at least one third region of the one conductivity type formed in one surface of the isolated region, at least one first metal region bonded to the third region, and at least one second metal region bonded to the isolated region, the junction between the first metal region and the third region constituting a Schottky barrier diode, the second region, the first region and the isolated region constituting a first transistor, and the third region, the isolated region and the semiconductor substrate constituting a second transistor.

The semiconductor layer comprises a P conductivity type or an N conductivity type semiconductor layer and is formed by vapour phase growth technique, for example. The impurity concentration of the semiconductor substrate is higher than that of the semiconductor layer and a PN junction is formed therebetween. The impurity concentration of the first region is higher than that of the semiconductor layer. Provision of the metal-semiconductor contact diode formed by the first metal region and the third region lowers the amplitude of the logical output voltage of the second transistor by the forward voltage of the diode thereby increasing the operation speed of the second transistor.

In the accompanying drawings:

FIGS. 1A through 5A are sectional views showing different embodiments of the semiconductor devices embodying the invention; and FIGS. 1B through 5B show equivalent circuits of the semiconductor devices shown in FIGS. 1A through 5A, respectively.

Throughout the drawings the same or corresponding portions are designated by the same reference characters.

In the embodiment shown in FIG. 1 a $\pi$ conductivity type or a p⁻ conductivity type semiconductor layer 12 is formed on an N⁺ conductivity type semiconductor substrate 11, for example, an N⁺ conductivity type silicon substrate.

The semiconductor layer 12 is so constructed as to have an impurity concentration of, for example, $10^{14}$ to $10^{16}$ atoms/cm³ which is lower than that of the semiconductor substrate 11. The layer 12 can be formed on the substrate 11 by, for example, epitaxially growing silicon to a film thickness of about 2 to 5 microns in an atmosphere containing boron, for example. Then, a silicon dioxide film 13 acting as an insulating film is formed on the layer 12 in a high temperature oxidizing atmosphere. An opening (not shown) having a predetermined pattern, for example, grid form, is formed through the silicon dioxide film 13 by, for example, photo-etching technique so as to form an N type region 14 by diffusing an impurity through the opening. For clear explanation, however, only one portion of the region 14 is shown in this example. Then a silicon oxide layer (not shown) containing phosphorus is formed on the silicon dioxide film 13 by vapour phase growth technique at a temperature of about 500° C and then the assembly thus obtained is heated to a high temperature of about 1200° C in a nonoxidizing atmosphere to cause the phosphorus to heat diffuse and reach the N+ conductivity type substrate 11 thus forming the N conductivity type region 14. This region 14 is so formed as to have an impurity concentration of, for example, $10^{16}$ to $10^{17}$ atoms/cm$^3$ which is higher than that of the layer 12. Thus, a portion of the layer is isolated from the remainder by region 14 and substrate 11 to define an isolated region 12A. Then, the silicon dioxide layer containing phosphorus is removed by etching thereby exposing again a portion of the N conductivity type region 14. Then, boron is heat diffused into the exposed surface of region 14 to a depth of about 1 to 2 microns by heating the assembly in an oxidizing atmosphere maintained at a temperature of 1100° C, for example, thus forming a P+ conductivity type region 15 in the region 14. An N conductivity type region 16 utilized to ground the substrate 11 is formed in layer 12 concurrently with region 14 or by an independent process step. The regions 15, 14 and 12A constitute the emitter, base and collector regions, respectively, of a lateral PNP transistor. Instead of forming the regions 14 and 15 by different process it is possible to form them by other method, for example, ion implantation technique.

Then, openings (not shown) are formed through the silicon dioxide film 13 at suitable portions thereof to diffuse phosphorus into the surface of the isolated region 12A in a high temperature oxidizing atmosphere to form N conductivity type regions 17 and 18 having an impurity concentration of $10^{16}$ to $10^{17}$ atoms/cm$^3$. Then, suitable openings are formed through the silicon dioxide film 13 to form metal electrodes 19A, 19B, 19C and 19D for regions 15, 16, 17 and 18, respectively and metal electrodes 19E, 19F and 19G for the isolated region 12A by well known wiring technique. These electrodes may be made of titanium, platinum or aluminum. The junctions between metal electrodes 19C, 19D and regions 17, 18 and the junctions between metal electrodes 19E, 19F, 19G and region 12A constitute first and second Schottky barrier diodes. It is important that the sum of the forward voltages of the first and second Schottky barrier diodes should be lower than the forward voltage at the PN junction between the substrate 11 and the isolated region 12A. A source terminal E$p$ and a grounding terminal E$n$ are connected to the electrodes 19A and 19B respectively, output terminals B2 and B1 are connected to the electrodes 19C and 19D respectively, and input terminals A1, A2 and A3 are connected to electrodes 19E, 19F and 19G respectively. The output terminals B1 and B2 are connected to a source via load, not shown.

Figure 1B:
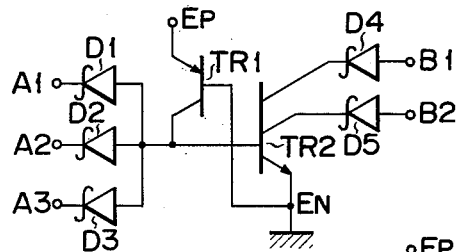

FIG. 1B shows the equivalent circuit of the semiconductor device shown in FIG. 1A. In FIG. 1B, TR1 represents a lateral PNP transistor constituted by regions 15, 14 and 12A, whereas TR2 represents a vertical NPN transistor constituted by regions 12A, 11, 17 and 18. $D_1$, $D_2$ and $D_3$ represent Schottky barrier diodes constituted by the region 12A and electrodes 19E, 19F and 19G, respectively, and $D_4$ and $D_5$ represent Schottky barrier diodes constituted by the regions 18 and 17 and electrodes 19D and 19C respectively. As shown, the grounding terminal E$n$ is grounded.

While a voltage of 0.7 volt, for example, is being impressed upon the source terminal, when all input terminals $A_1$, $A_2$ and $A_3$ are opened or supplied with a suitable positive voltage higher than the threshold voltage of transistor TR2, the holes injected into the base region 14 from the emitter region of the lateral transistor will reach the collector region, or the base region of the vertical NPN transistor. The excess holes injected into the base region 12 cause electrons to inject into the base region from the emitter region. In other words, the vertical transistor is turned on with the result that the voltage at output terminals B1 and B2 becomes equal to the sum of the saturation voltage between the collector-emitter regions of the vertical transistor and the forward voltage of diodes D4 and D5.

When the voltage of at least one of the input terminals A1, A2 and A3 is reduced to zero, the vertical transistor becomes off thus producing positive voltage at output terminals $B_1$ and $B_2$. As a consequence, the amplitude of the logical output of the semiconductor device shown in FIG. 1A will become equal to the difference between the forward voltage of the emitter-base junction of the vertical NPN transistor, and the sum of the saturation voltage across the collector-emitter regions of the vertical transistor, and the forward voltages across input diodes D1, D2 and D3 and the output diodes D4 and D5.

Thus, the semiconductor device illustrated in FIG. 1A can operate as a multi-input multi-output NAND circuit that produces a binary "0" output only when all inputs are binary "1" thereby forming a logic element having an extremely small amplitude output.

In the semiconductor device shown in FIG. 1A, as it is possible to make extremely narrow the width of the base region of the lateral transistor, the carriers injected are subjected to the action of the acceleration electric field created by the impurity concentration distribution in respective regions so that it is possible to greatly improve the injection efficiency and the carrier transfer efficiency. For this reason, it is possible to obtain high current amplification factor over a wide range of the current, thus greatly decreasing the power consumption of the logic circuit. Further, as the vertical transistor utilizing the semiconductor substrate 11 as the emitter region is used as an inverter element, it is possible to obtain high current amplification factor and gain-bandwidth product over a wide range of the current.

Although in the embodiment shown, three input diodes D1, D2 and D3 are formed, it is also possible to use the semiconductor device as an inverter element by forming only one input diode.

The output diodes cooperate with the input diodes to prevent current hogging phenomena. As a consequence, the current amplification factor of the vertical transistor when it operates in the reverse direction can be reduced whereby the amount of excess carriers accumulated in the base and collector regions is limited thus increasing the invention speed of the output. Furthermore the input and output diodes are effective to reduce the amplitude of the output from the logic element by the sum of the forward voltages of the input and output diodes, with the result that the operating speed of the logic element is increased.

Figure 2A:
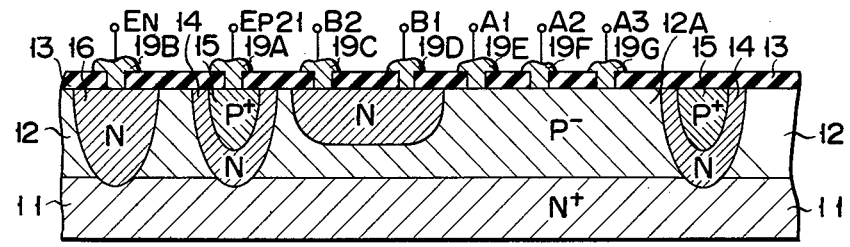
Figure 2B:
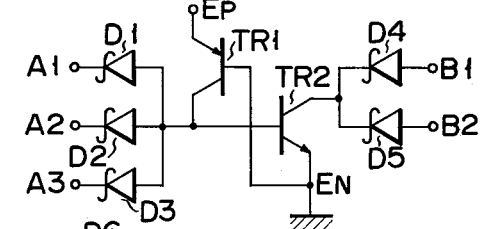

FIG. 2A shows another embodiment of this invention which is similar to that shown in FIG. 1A except that two electrodes 19C and 19D are provided for a single collector region 21 of the vertical transistor. FIG. 2B shows the equivalent circuit of the semiconductor device shown in FIG. 2A.

It is also possible to form a plurality of regions 21. Similar to the semiconductor device shown in FIG. 1A, this embodiment too can be used as a multi-input multi-output NAND circuit.

Figure 3A:
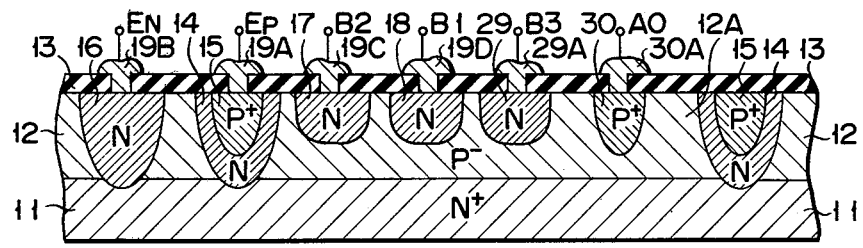
Figure 3B:
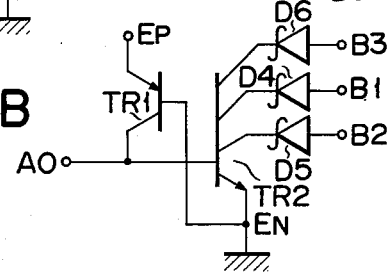

FIG. 3A shows still another embodiment of this invention which is similar to the semiconductor device shown in FIG. 1A except that the vertical NPN transistor is provided with an additional collector region 29 and that instead of using electrodes 19E, 19F and 19G which constitute the input diodes, an electrode 30A is provided to form an ohmic contact to region 12A via a P+ conductivity type region 30 which is formed, for example, in the process step in which the region 15 is formed. An input terminal $A_0$ is connected to electrode 30A. The equivalent circuit of this modification is shown in FIG. 3B. The junction between electrode 30A and region 30 forms a diode $D_6$. Although three collector regions of the vertical transistor are shown, it will be clear that the number of the collector regions is not limited to three. This embodiment can also act as a multi-output inverter and has the same advantages as those of the first embodiment.

Figure 4A:
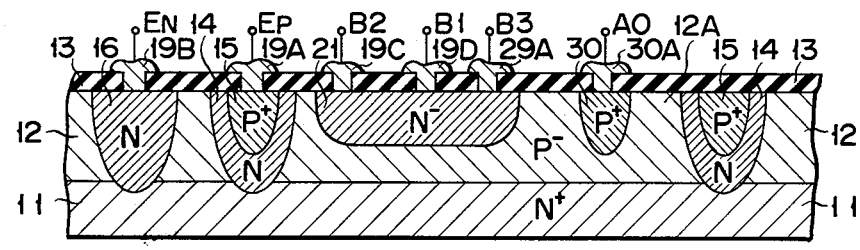
Figure 4B:
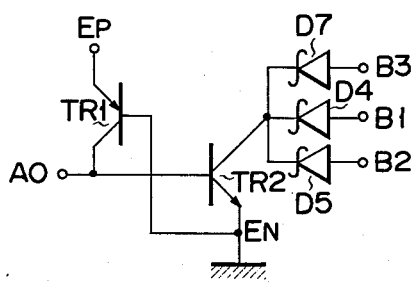

FIG. 4A shows another embodiment of this invention. This embodiment is similar to that shown in FIG. 3A except that instead of providing three collector regions 17, 18 and 19, a single collector region 21 is provided and that electrodes 19C, 19D and 29A are provided for the collector region 21. The equivalent circuit of this embodiment is shown in FIG. 4B in which $D_7$ designates a Schottky barrier diode formed by the junction between electrode 29A and the collector region 21. It is also possible to provide a plurality of collector regions. It is also possible to operate this semiconductor device as a multi-output inverter element. This embodiment too has the same advantages as those of the first embodiment.

Figure 5A:
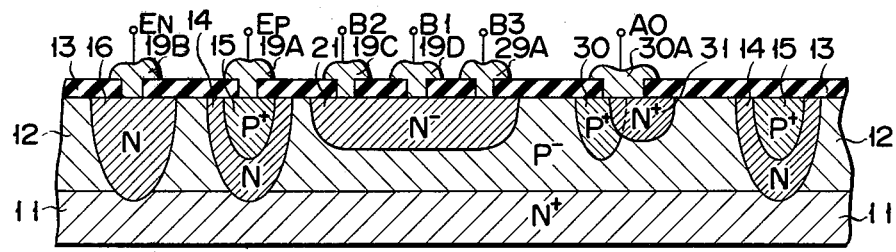
Figure 5B:
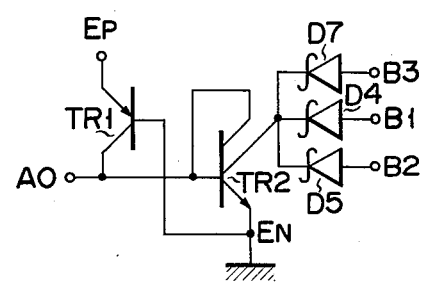

FIG. 5A illustrates yet another embodiment of this invention which is similar to the semiconductor device shown in FIG. 4A except that an N+ conductivity type region 31 is formed to extend into a region 30, and that an electrode 30A is formed to contact both regions 30 and 31. The equivalent circuit of this embodiment is shown in FIG. 5B.

In this embodiment, provision of regions 30 and 31 which are interconnected electrically is effective to remove the excessive minority carriers accumulated in the base region of the vertical NPN transistor, thus increasing the operating speed of the semiconductor device. It is also possible to provide a plurality of electrodes 30A to enable the semiconductor device to act as a multi-output inverter element.

Although the invention has been shown and described in terms of some specific embodiments it should be understood that the invention is not limited to these specific embodiments. For example, a similar effective semiconductor device can be formed by using a P+ conductivity type substrate 11, by determining the conductivity type of various regions in accordance with the conductivity type of the substrate 11 and by applying voltages of the polarity opposite to that of the illustrated embodiment to the source terminal and the input terminal.

What we claim is:

1. A semiconductor circuit having a plurality of stages, each stage comprising at least one output terminal, at least one input terminal, a first transistor having an emitter connected to a power source, and collector connected to said input terminal through a first diode and a second transistor having conductivity type opposite to that of said first transistor and including an emitter and base respectively connected to the base and collector of said first transistor and at least one collector connected to said output terminal through a second diode, the output terminal of one of said stages being connected to the input terminal of a succeeding stage.

2. A semiconductor circuit according to claim 1 wherein said first transistor comprises a PNP transistor, said second transistor comprises an NPN transistor, the cathode electrode of said first diode is connected to said input terminal and the anode electrode of said second diode is connected to the output terminal.

3. A semiconductor device comprising a semiconductor substrate of one conductivity type, a semiconductor layer of the opposite conductivity type and formed on said semiconductor substrate, a first region of said one conductivity type extending into said semiconductor substrate to surround a portion of said semiconductor layer thereby defining an isolated region of the opposite conductivity type, a second region of the opposite conductivity type formed in said first region, at least one third region of said conductivity type formed in one surface of said isolated region, at least one metal region bonded to said third region to form a Schottky barrier diode therebetween, and at least one second metal region bonded to said isolated region to form a Schottky barrier diode therebetween, wherein said second region, said first region and said isolated region constitute a first transistor, and said third region, said isolated region and said semiconductor substrate constitute a second transistor, and the sum of the forward voltages of the Schottky diode formed between said first metal region and said third region and that formed between said second metal region and said semiconductor layer is lower than the forward voltage at the junction between said substrate and said isolated region.

4. A semiconductor device according to claim 3 wherein said one conductivity type is of the N type and said opposite conductivity type is of the P type.

* * * * *